United States Patent
Tseng et al.

(10) Patent No.: US 9,219,109 B2
(45) Date of Patent: Dec. 22, 2015

(54) INDUCTOR STRUCTURE WITH MAGNETIC MATERIAL

(71) Applicant: Taiwan Semiconductor Manufacturing Co., Ltd, Hsin-Chu (TW)

(72) Inventors: Yuan-Tai Tseng, Hsinchu County (TW); Ming-Chyi Liu, Hsinchu (TW); Chung-Yen Chou, Hsinchu (TW); Chia-Shiung Tsai, Hsin-Chu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 14/712,329

(22) Filed: May 14, 2015

(65) Prior Publication Data

US 2015/0249121 A1    Sep. 3, 2015

Related U.S. Application Data

(63) Continuation of application No. 14/044,979, filed on Oct. 3, 2013, now Pat. No. 9,048,128.

(51) Int. Cl.
*H01L 29/00* (2006.01)
*H01L 49/02* (2006.01)

(52) U.S. Cl.
CPC ..................................... *H01L 28/10* (2013.01)

(58) Field of Classification Search
CPC ..... H01L 29/00; H01L 28/10; H01L 23/5227; H01L 2924/3011
USPC .................................. 257/421, 531, E29.323
See application file for complete search history.

(56) References Cited

U.S. PATENT DOCUMENTS

| | | | |
|---|---|---|---|
| 6,846,683 B2 * | 1/2005 | Low | 438/3 |
| 2004/0100855 A1 * | 5/2004 | Saito et al. | 365/232 |
| 2006/0082929 A1 * | 4/2006 | Kiyono et al. | 360/317 |
| 2006/0273418 A1 * | 12/2006 | Chung et al. | 257/421 |
| 2008/0002297 A1 * | 1/2008 | Shirotori et al. | 360/135 |
| 2010/0295649 A1 | 11/2010 | Gardner | |
| 2010/0320551 A1 * | 12/2010 | Wilson et al. | 257/421 |
| 2011/0169596 A1 * | 7/2011 | Ahrens et al. | 336/200 |
| 2012/0242438 A1 * | 9/2012 | Morise et al. | 335/302 |

\* cited by examiner

*Primary Examiner* — Phuc Dang
(74) *Attorney, Agent, or Firm* — McClure, Qualey & Rodack, LLP

(57) ABSTRACT

The mechanisms for forming an inductor structure are provided. The inductor structure includes a substrate and a first dielectric layer formed over the substrate. The inductor structure also includes a first metal layer formed in the first dielectric layer and a magnetic layer formed over the first dielectric layer, and the magnetic layer has edges more than four in a cross section view.

20 Claims, 8 Drawing Sheets

INDUCTOR STRUCTURE WITH MAGNETIC MATERIAL

CROSS REFERENCE TO RELATED APPLICATIONS

This application is a Continuation application of U.S. patent application Ser. No. 14/044,979, filed on Oct. 3, 2013, U.S. Pat. No. 9,048,128, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Generally, an inductor is a passive electrical component that can store energy in a magnetic field created by an electric current passing through it. An inductor may be constructed as a coil of conductive material wrapped around a core of dielectric material. One parameter of an inductor that may be measured is the inductor's ability to store magnetic energy, also known as the inductor's inductance. Another parameter that may be measured is the inductor's Quality (Q) factor. The Q factor of an inductor is a measure of the inductor's efficiency and may be calculated as the ratio of the inductor's inductive reactance to the inductor's resistance at a given frequency.

Inductors may be utilized in a wide variety of applications. One such application of an inductor may be as a choke, in which an inductor is designed to have a high inductive reactance to, or block, signals with certain frequencies in an electrical circuit while allowing passage of other signals at different frequencies in the electrical circuit. A choke may be made, for example to block a radio frequency (RF), and may be called a RF choke, which is of use in radio communications.

However, there are many challenges for forming the inductor.

BRIEF DESCRIPTION OF THE DRAWING

For a more complete understanding of the present disclosure, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. Throughout the various views and illustrative embodiments, like reference numbers are used to designate like elements.

Figure 1A:
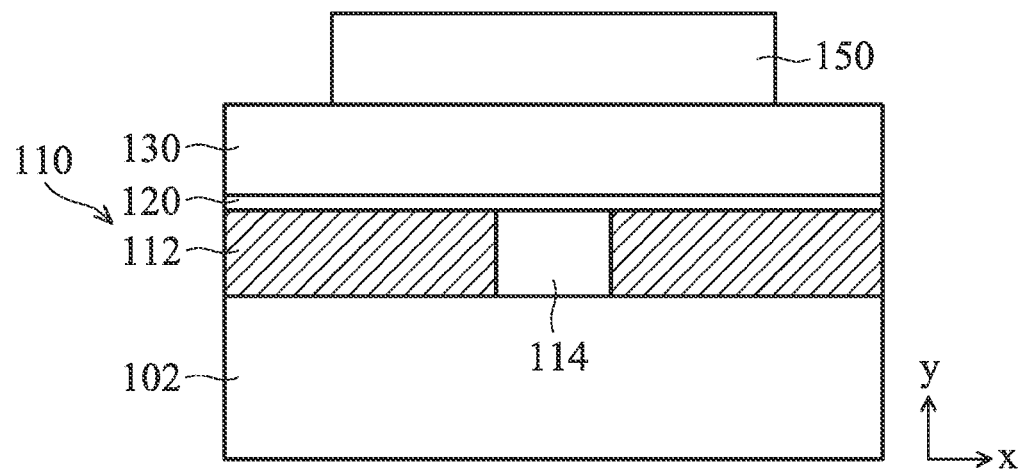
FIGS. 1A-1C show cross-sectional representations of various stages of forming an inductor structure, in accordance with some embodiments of the disclosure.
Figure 1B:
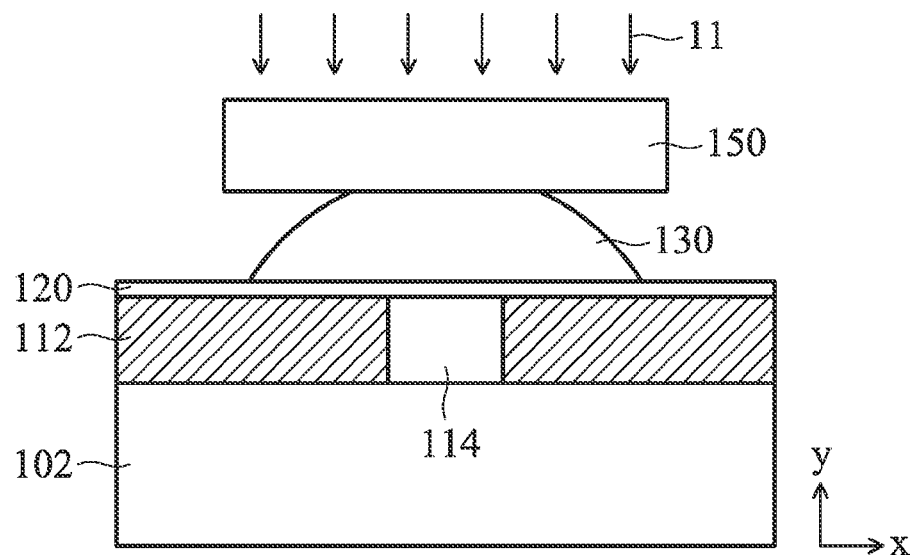
Figure 1C:
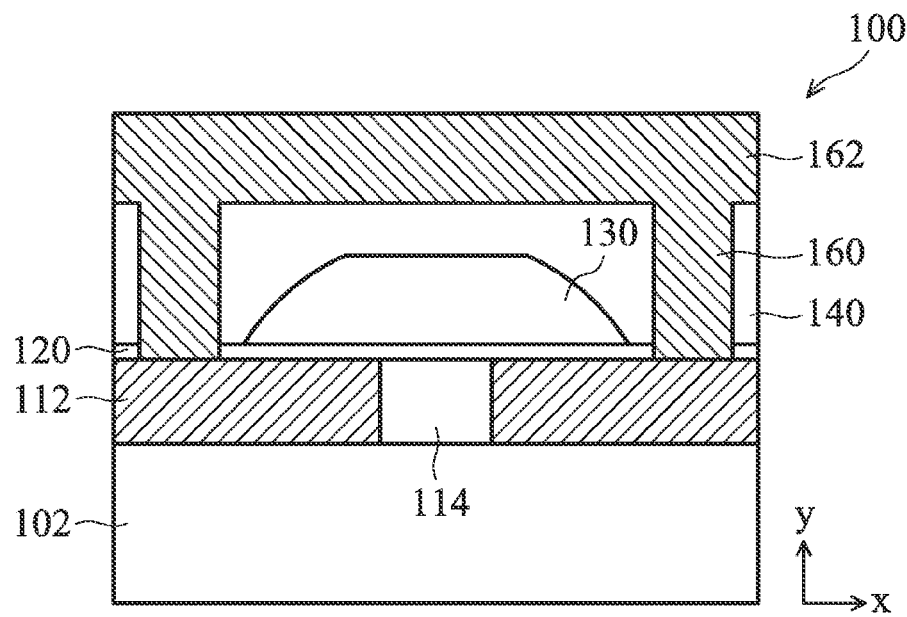

Embodiments of mechanisms for forming an inductor structure 100 are provided. FIGS. 1A-1C show cross-sectional representations of various stages of forming an inductor structure 100 in accordance with some embodiments of the disclosure. However, it should be noted that FIGS. 1A to 1C have been simplified for the sake of clarity to better understand the inventive concepts of the disclosure. Additional features can be added in inductor structure 100, and some of the features below can be replaced or eliminated.

Referring to FIG. 1A, a semiconductor substrate 102 is provided. Semiconductor substrate 102 may be made of silicon or other semiconductor materials. Alternatively or additionally, semiconductor substrate 102 may include other elementary semiconductor materials such as germanium. In some embodiments, semiconductor substrate 102 is made of a compound semiconductor such as silicon carbide, gallium arsenic, indium arsenide, or indium phosphide. In some embodiments, semiconductor substrate 102 is made of an alloy semiconductor such as silicon germanium, silicon germanium carbide, gallium arsenic phosphide, or gallium indium phosphide. In some embodiments, semiconductor substrate 102 includes an epitaxial layer. For example, semiconductor substrate 102 has an epitaxial layer overlying a bulk semiconductor.

Semiconductor substrate 102 may further include isolation features (not shown), such as shallow trench isolation (STI) features or local oxidation of silicon (LOCOS) features. The isolation features may define and isolate various integrated circuit devices. Integrated circuit devices, such as metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, or other suitable elements, are formed in and/or on semiconductor substrate 102.

Semiconductor substrate 102 may also include various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, fin-like field effect transistors (FinFETs), imaging sensor, light emitting diode (LED), or other applicable components.

Semiconductor substrate 102 may also include gate stacks formed by dielectric layers and electrode layers. The dielectric layers may include an interfacial layer (IL) and a high-k (HK) dielectric layer. The dielectric layers are deposited by suitable techniques, such as chemical vapor deposition (CVD), atomic layer deposition (ALD), physical vapor deposition (PVD), thermal oxidation, or other applicable techniques. The electrode layers may include a single layer or multiple layers, such as metal layer, liner layer, wetting layer, and adhesion layer, formed by ALD, PVD, CVD, or other applicable process.

As shown in FIG. 1A, an interconnect structure 110 is formed over semiconductor substrate 102. In some embodiments, interconnect structure 110 is embedded in inter-metal dielectric (IMD) layers 114. Interconnect structure 110 is configured to couple the various p-type and n-type doped regions and the other functional features (such as gate electrodes), resulting a functional integrated circuit. Interconnect structure 110 includes first metal layer 112, contacts (not shown) and via features (not shown). In some embodiments, first metal layer 112 is the topmost metal layer and called as $M_{top}$. First metal layer 112 provides horizontal electrical routing. The contacts provide vertical connection between silicon substrate and metal lines while via features provide vertical connection between metal lines in different metal layers. In some embodiments, inter-metal dielectric (IMD) layers 114 is made by silicon oxide, silicon nitride, silicon oxy-nitride, silicon carbide, BSG, BPSG, low-k or ultra low-k dielectrics.

In some embodiments, interconnect structure 110 is formed in a back-end-of-line (BEOL) process. First metal layer 112 may be made of conductive material, such as copper (Cu), copper alloy, aluminum (Al), aluminum alloy, tungsten (W), tungsten alloy, or applicable materials. In some embodiments, first metal layer 112 is copper or copper alloy. In some embodiments, first metal layer 112 is formed by single and/or dual damascence processes.

As shown in FIG. 1A, an etching stop layer 120 is formed over interconnect structure 110. In some embodiments, etching stop layer 120 is made of silicon nitride.

After forming etching stop layer 120 over interconnect structure 110, a magnetic layer 130 is formed over etching stop layer 120. Magnetic layer 130 is insulated from metal lines 112 by etching stop layer 120. Magnetic layer 130 includes cobalt (Co), zirconium (Zr), tantalum (Ta) and niobium (Nb), rhenium (Re), neodymium (Nd), praseodymium (Pr), or dysprosium (Dy).

In some embodiments, magnetic layer 130 includes an amorphous cobalt (Co) alloy including cobalt (Co) and zirconium (Zr). Zirconium (Zr) helps make cobalt (Co) amorphous. In some embodiments, magnetic layer 130 includes a cobalt-zirconium (CoZr) alloy having one or more additional elements, such as tantalum (Ta) and niobium (Nb). In some other embodiments, magnetic layer 130 includes a cobalt-zirconium (CoZr) alloy having one or more additional elements, such as a rare earth element, that help increase the ferromagnetic resonance of the cobalt-zirconium (CoZr) alloy. Rare earth elements include rhenium (Re), neodymium (Nd), praseodymium (Pr), or dysprosium (Dy).

Afterwards, a photoresist layer 150 is formed over magnetic layer 130. Photoresist layer 150 is patterned by a photolithography process to form a pattered photoresist layer 150. In some embodiments, photoresist layer 150 is a positive photoresist and includes a polymer which is photo-solubilized when exposed to light. In some embodiments, photoresist layer 150 is formed by a spin-on coating method.

After forming patterned photoresist layer 150 over magnetic layer 130, an etching process 11 is performed on magnetic layer 130 as shown in FIG. 1B in accordance with some embodiments of the disclosure. Etching process 11 is used to remove a portion of magnetic layer 130. In some embodiments, an etching solution used in etching process 11 includes HF, $HNO_3$ and water. In some embodiments, etching process 11 is operated at a temperature in a range from about 15° C. to about 40° C.

However, as shown in FIG. 1B, a lateral etching rate of etching process 11 in X-direction is larger than a vertical etching rate of etching process 11 in Y-direction. Therefore, a lateral portion of magnetic layer 130 is etched heavily than a vertical portion of magnetic layer 130. As a result, a volume of magnetic layer 130 is largely decreased by etching process 11.

Afterwards, a second inter-metal dielectric (IMD) layer 140 is formed over magnetic layer 130 and etching stop layer 120 as shown in FIG. 1C in accordance with some embodiments of disclosure. Trenches are formed in second IMD layer 140 by a photolithography process and an etching process. Conductive materials are filling into the trenches to form vias 160 and second metal layer 162. In some embodiments, a spiral structure is made by first metal layer 112, the vias 160 and second metal layer 162.

Vias 160 are formed in second IMD layer 140, and a second metal layer 162 is formed over vias 160 and second IMD layer 140. Vias 160 and Second metal layer 162 independently may be made of conductive material, such as copper (Cu), copper alloy, aluminum (Al), aluminum alloy, tungsten (W), tungsten alloy, or applicable materials. In some embodiments, inductor structure 100 is made by magnetic layer 130, first metal layer 112, the vias 160 and second metal layer 162.

As mentioned above, the lateral etching rate of etching process 11 in X-direction is larger than the vertical etching rate of etching process 11 in Y-direction. Therefore, the volume of magnetic layer 130 is largely decreased by etching process 11. Furthermore, the performance of inductor structure 100 is decreased by the small volume of magnetic layer 130. For example, a Q factor of inductor structure 100 is decreased due to small volume of magnetic layer 130. In order to improve performance of inductor structure 100, a large volume of magnetic layer 130 is needed.

Figure 2A:
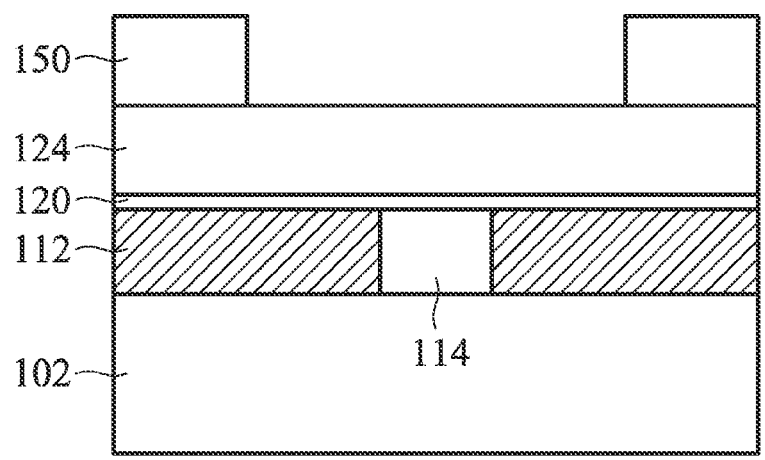
FIGS. 2A-2H shows cross-sectional representation of various stages of forming an inductor structure, in accordance with some embodiments of the disclosure.

FIGS. 2A-2H show cross-sectional representations of various stages of forming inductor structure 100 in accordance with some embodiments of the disclosure. Referring to FIG. 2A, an oxide layer 124 is deposited on etch stop layer 120. In some embodiments, oxide layer 124 is made of silicon oxide, silicon nitride, silicon oxy-nitride, silicon carbide, borosilicate glass (BSG), borophosphosilicate glass (BPSG). After forming oxide layer 124, photoresist layer 150 is formed over oxide layer 124. Afterwards, photoresist layer 150 is patterned by a photolithography process to form a pattered photoresist layer 150.

Figure 2B:
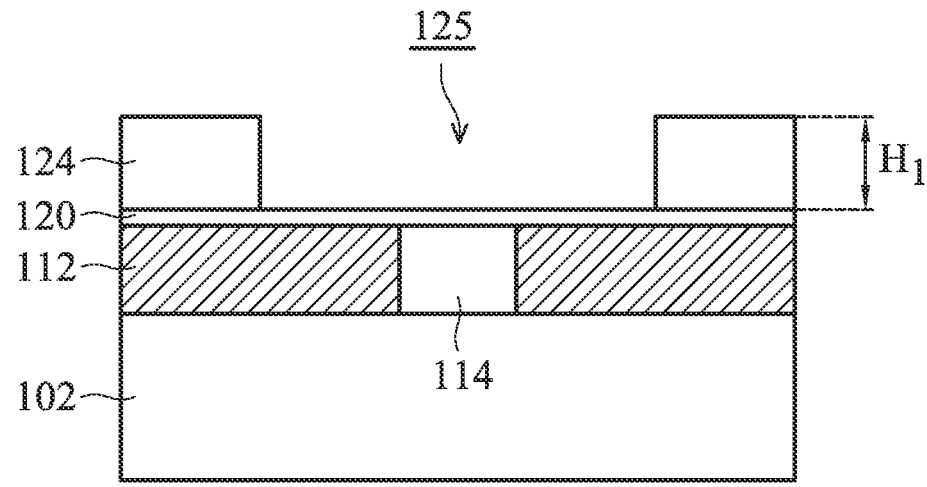

After forming pattered photoresist layer 150, oxide layer 124 is patterned by using pattered photoresist layer 150 as a mask to form a patterned oxide layer 124 as shown in FIG. 2B in accordance with some embodiments of disclosure. In some embodiments, the material of oxide layer 124 is the same as that of inter-metal dielectric (IMD) layers 114. In some embodiments, oxide layer 124 has a height in a range from about 0.5 μm to about 20 μm. As shown in FIG. 2B, an opening 125 is formed in oxide layer 124.

Figure 2C:
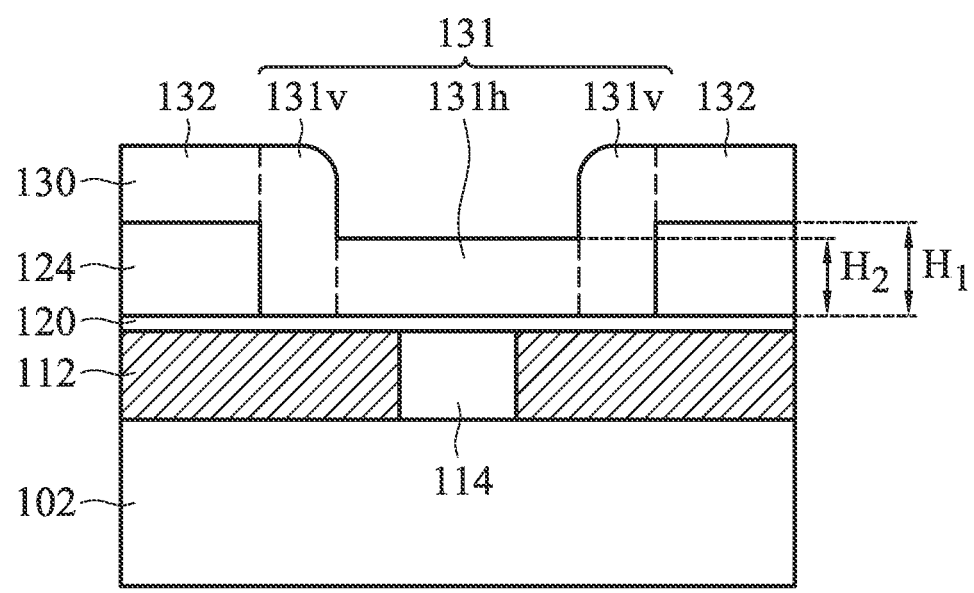
Figure 3A:
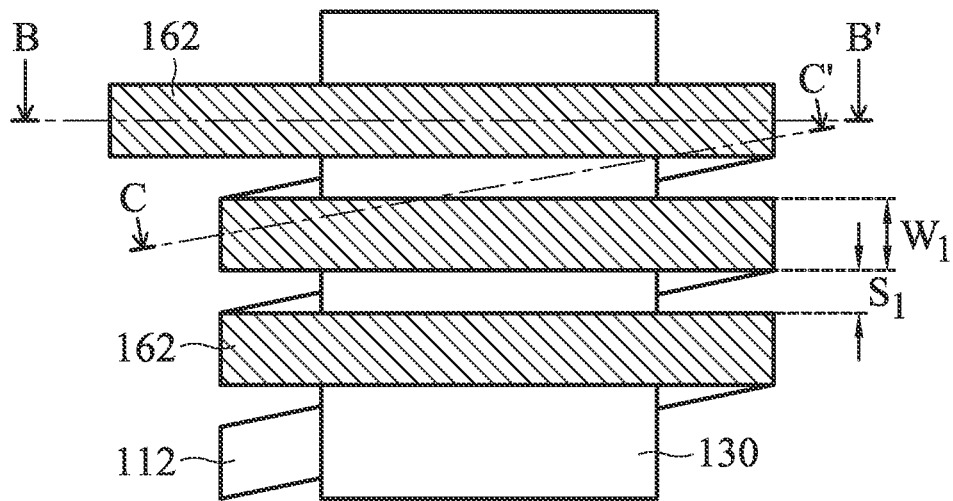
FIG. 3A shows a top-view of an inductor structure, in accordance with some embodiments of the disclosure.

After oxide layer 124 is patterned, magnetic layer 130 is conformally formed on oxide layer 124 to fill into opening 125 as shown in FIG. 2C in accordance with some embodiments of disclosure. Magnetic layer 130 is disposed in the central portion (or core) of inductor structure 100 (as shown in FIG. 3A) to increase the inductance of inductor structure 100.

Magnetic layer 130 has two portions including first portion 131 over etch stop layer and a second portion 132 over oxide layer 124. First portion further includes a horizontal portion 131h and a vertical portion 131v, and the vertical portion 131v lines with sidewall of opening 125. The horizontal portion 131h of first portion 131 of magnetic layer 130 has a height $H_2$. In some embodiments, height $H_1$ of oxide layer 124 is larger than or equal to height $H_2$ of horizontal portion 131h. In some embodiments, a ratio ($H_1/H_2$) of height $H_1$ to height $H_2$ is in a range from about 0.2 to about 5.

Figure 2D:
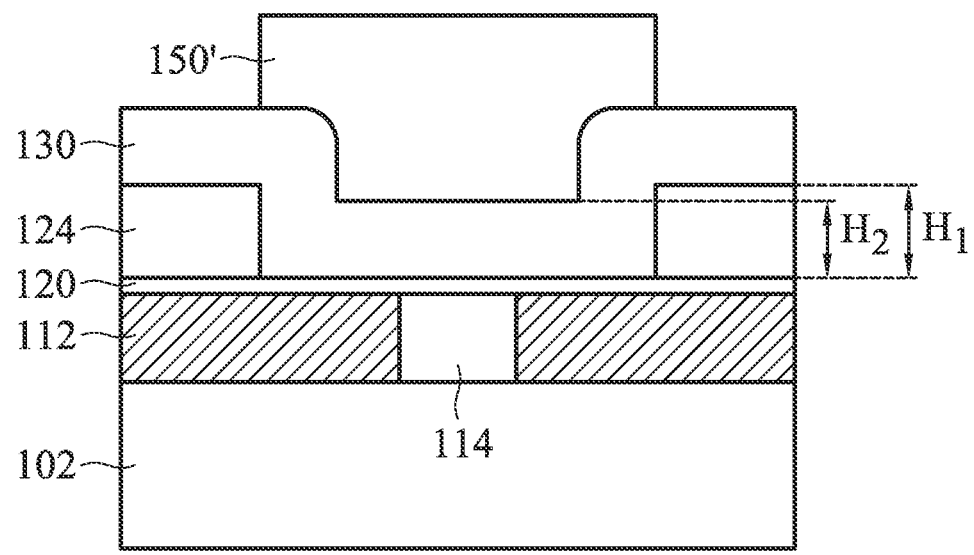

After magnetic layer 130 is formed over etch stop layer 120 and oxide layer 124, a second photoresist layer 150' is conformally formed over the first portion of magnetic layer 130 as shown in FIG. 2D in accordance with some embodiments of disclosure. In some embodiments, a mask used to form patterned photoresist layer 150 in FIG. 2A has a clear tone, and the same mask used to form second patterned photoresist layer 150' in FIG. 2D has a dark tone. Thus, patterned photoresist layer 150 and second patterned photoresist layer 150' are formed by using the same mask without two masks.

Figure 2E:
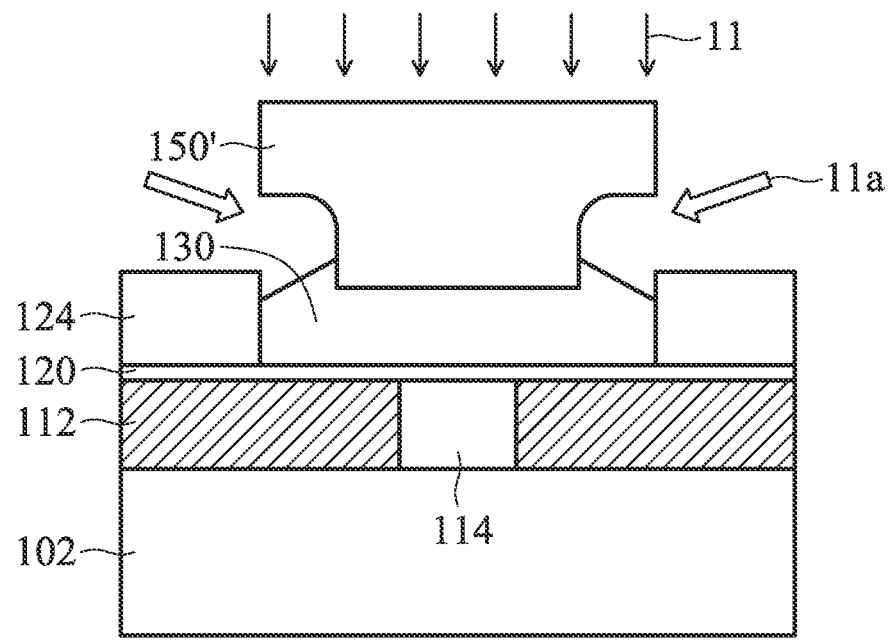

After second patterned photoresist layer 150' are formed over magnetic layer 130, etching process 11 is performed on magnetic layer 130 as shown in FIG. 2E in accordance with some embodiments of disclosure. Etching process 11 is used to remove a portion of magnetic layer 130. In some embodiments, an etching solution used in etching process 11 includes HF in a range from about 3% to about 15%, $HNO_3$ in a range from about 10% to about 50%, and water in a range from about 30% to about 90%. In some embodiments, etching process 11 is operated at a temperature in a range from about 15° C. to about 40° C.

As mentioned above, the lateral etching rate of etching process 11 in X-direction is larger than the vertical etching rate of etching process 11 in Y-direction. It should be noted that because oxide layer 124 is formed below magnetic layer 130 to raise a portion of magnetic layer 130. A top surface of second portion 132 of magnetic layer 130 is higher than a top surface of first portion 131 of magnetic layer 130. Since lateral etching rate of etching process 11 is larger than vertical etching rate, as mentioned above, second portion 132 of magnetic layer 130 is etched firstly, and vertical portion 131v of first portion 131 of magnetic layer 130 is etched afterwards. Therefore, horizontal portion 131h of first portion of magnetic layer 130 is slightly etching due to the protection of oxide layer 124.

It should be noted that oxide layer 124 provides a base to raise a portion of magnetic layer 130. Additionally, oxide layer 124 is as a protection layer to prevent magnetic layer 130 from over etching. Therefore, the volume of magnetic layer 130 is not decreased largely by etching process 11.

Figure 2F:
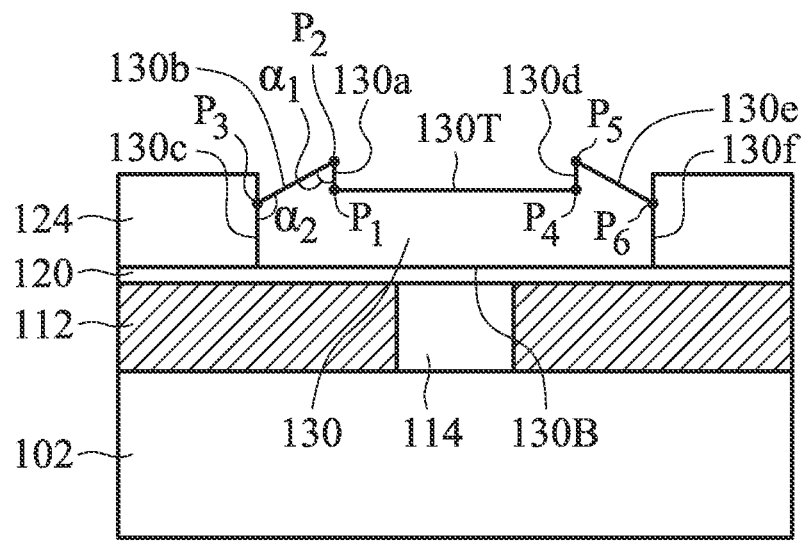
Figure 2F:
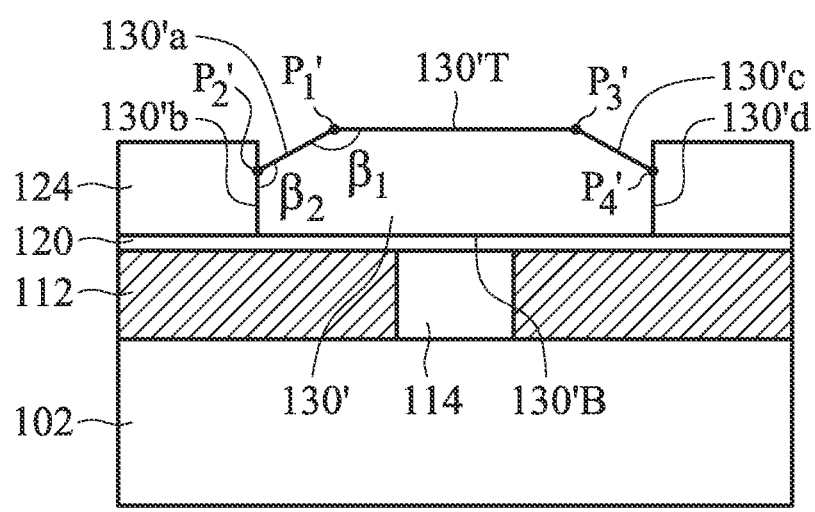

After etching process 11, magnetic layer 130 has polygon structure as shown in FIG. 2F in accordance with some embodiments of disclosure. As shown in FIG. 2F, Magnetic layer 130 has an octagon structure. Magnetic layer 130 has a top surface 130T, a first sidewall surface 130a, a second sidewall surface 130b, a third sidewall surface 130c, a bottom surface 130B, a fourth sidewall surface 130d, a fifth sidewall surface 130e and a sixth sidewall surface 130f. Top surface 130T is a top planar surface, and bottom surface 130B is a bottom planar surface. Top surface 130T is parallel to bottom surface 130B.

Magnetic layer 130 has right sidewall surfaces and left sidewall surfaces which are disposed oppositely to each other. Right sidewall surfaces include first sidewall surface 130a, second sidewall surface 130b and third sidewall surface 130c. Left sidewall surfaces include first sidewall surface 130a, second sidewall surface 130b and third sidewall surface 130c. The right sidewall surfaces of magnetic layer 130 have three intersection points. An first intersection point $P_1$ is formed between top surface 130T and first sidewall surface 130a, and an second intersection point $P_2$ is formed between first sidewall surface 130a and second sidewall surface 130b, and a third intersection point $P_3$ is formed between second sidewall surface 130b and third sidewall surface 130c. Similarly, the left sidewall surfaces of magnetic layer 130 have at least two intersection points including fourth intersection point $P_4$, fifth intersection point $P_5$ and sixth intersection point $P_6$.

In some embodiments, an angle $\alpha_1$ between first sidewall surface 130a and second sidewall surface 130b is in a range from about 30 degrees to about 85 degrees. In some embodiments, an angle $\alpha_2$ between second sidewall surface 130b and third sidewall surface 130c is in a range from about 95 degrees to about 150 degrees.

In some other embodiments, magnetic layer 130' has a trapezoid structure as shown in FIG. 2F' in accordance with some embodiments of disclosure. Magnetic layer 130' has a top surface 130'T, a first sidewall surface 130a, a second sidewall surface 130'b, a bottom surface 130'B, a third sidewall surface 130c and a fourth sidewall surface 130'd. Top surface 130'T is a top planar surface, and bottom surface 130'B is a bottom planar surface. Top surface 130'T is parallel to bottom surface 130'B.

The right sidewall surfaces of magnetic layer 130' have two intersection points. An first intersection point $P_1'$ is formed between top surface 130'T and first sidewall surface 130'a, and an second intersection point $P_2'$ is formed between first sidewall surface 130'a and second sidewall surface 130'b. Similarly, the left sidewall surfaces of magnetic layer 130' have at least two intersection points including third intersection point $P_3'$, fourth intersection point $P_4'$.

In some embodiments, an angle $\beta_1$ between first sidewall surface 130'a and second sidewall surface 130'b is in a range from about 120 degrees to about 175 degrees. In some embodiments, an angle $\beta_2$ between second sidewall surface 130'b and third sidewall surface 130'c is in a range from about 95 degrees to about 150 degrees.

Figure 2G:
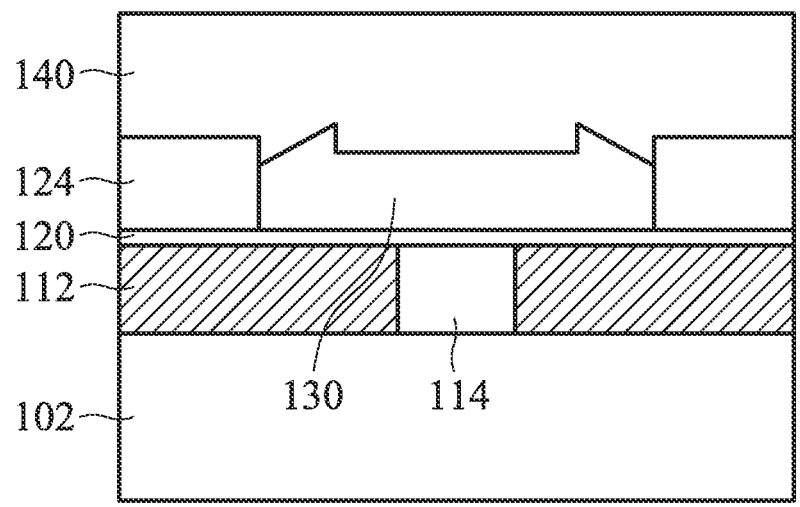

After magnetic layer 130 is etched by etching process 11, second inter-metal dielectric (IMD) layer 140 is formed over oxide layer 124 and magnetic layer 130 as shown in FIG. 2G in accordance with some embodiments of disclosure.

Figure 2H:
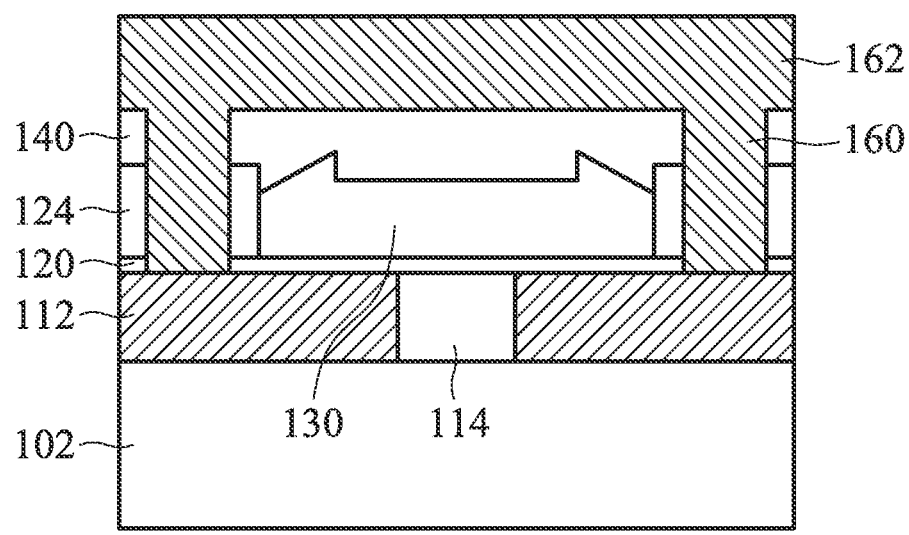

Afterwards, as shown in FIG. 2H, trenches are formed in second IMD layer 140 by a photolithography process and an etching process. Conductive materials are filling into the trenches to form vias 160 and second metal layer 162. Second metal layer 162 is electrically connected to first metal layer 112 through vias 160. Inductor structure 100 is constructed by first metal layer 114, second metal layer 162 and magnetic layer 130.

It should be noted that a portion of magnetic layer 130 is formed on oxide layer 124 (as shown in FIG. 2D). Therefore, the vertical portion of magnetic layer 130 lining with sidewall of opening 125 is etching firstly by etching process 11 (as shown etching direction marked as an arrow 11a). Compared with magnetic layer 130 shown in FIG. 1C, magnetic layer 130 shown in FIGS. 2F and 2F' has a larger volume. As a result, performance of inductor structure 100 including large volume of magnetic layer 130 has a better performance (high Q factor).

FIG. 3A shows a top-view of inductor structure 100, in accordance with some embodiments of the disclosure. A spiral structure is made by first metal layer 112, the vias 160 and second metal layer 162. Magnetic layer 130 formed by processes of FIG. 2A-2H is disposed in a central portion of inductor structure 100 and surrounded by the spiral structure. Magnetic layer 130 has the polygon structure, such as octagon or trapezoid structure with a large volume to increase the Q factor of inductor structure 100.

Figure 3B:
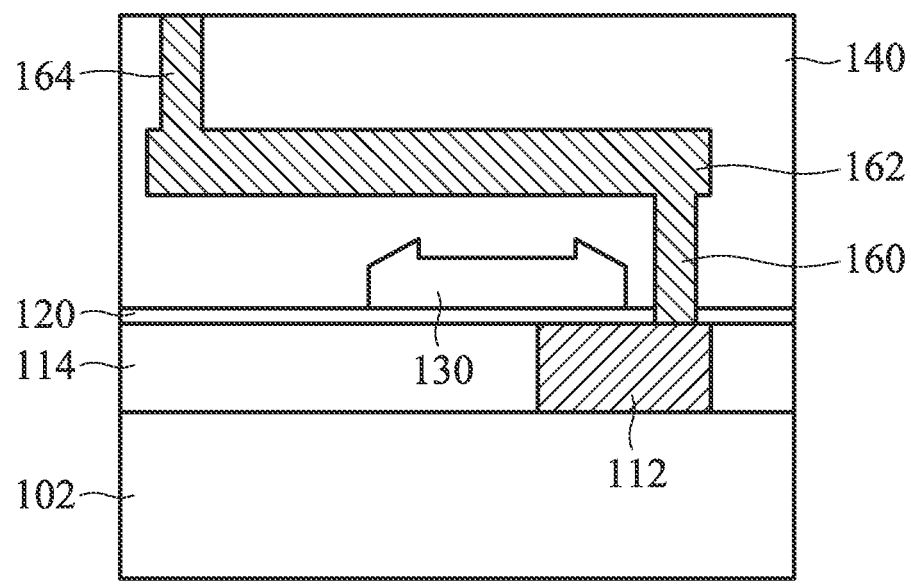
FIG. 3B shows a cross-sectional representation of an inductor structure along BB' in FIG. 3A, in accordance with some embodiments of the disclosure.

FIG. 3B shows a cross-sectional representation of an inductor structure 100 along BB' in FIG. 3A in accordance with some embodiments of the disclosure. First metal layer 114 is electrically connected to second metal layer 162 through vias 160, and second metal layer 162 is electrically connected to a third metal layer (not shown) through a second via 164.

Figure 3C:
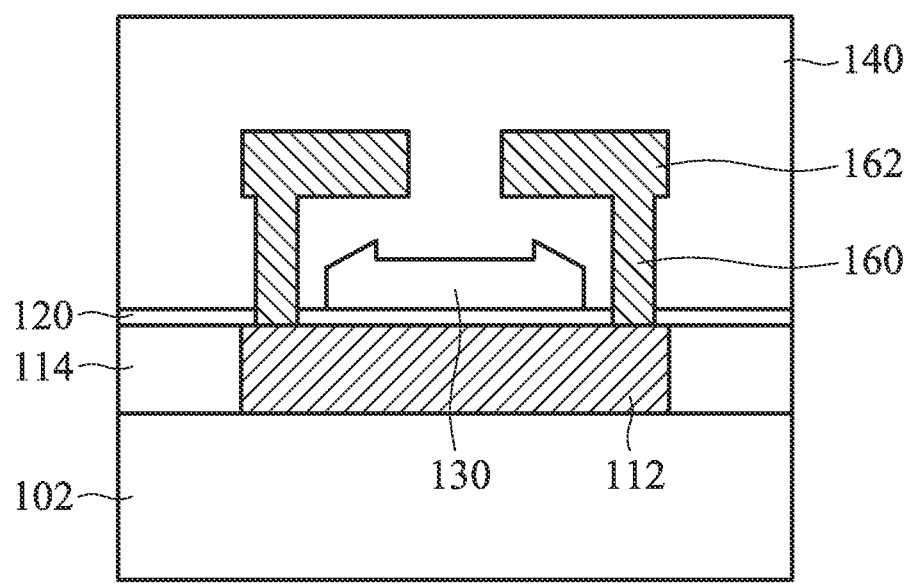
FIG. 3C shows a cross-sectional representation of an inductor structure along CB' in FIG. 3A, in accordance with some embodiments of the disclosure.

FIG. 3C shows a cross-sectional representation of an inductor structure 100 along CB' in FIG. 3A in accordance with some embodiments of the disclosure. Magnetic layer 130 has the octagon structure with the large volume to increase the Q factor of inductor structure 100.

Embodiments of mechanisms of forming an inductor structure are provided. A magnetic layer is disposed in the central portion (or core) of an inductor structure to increase the inductance of the inductor structure. An oxide layer is formed below a portion of the magnetic layer to prevent the magnetic layer from over etching. Therefore, a large volume of inductor structure is obtained. The performance of the inductor structure is improved by increasing the volume of inductor structure. In addition, the Q factor of inductor structure is further improved.

In some embodiments, an inductor structure is provided. The inductor structure includes a substrate and a first dielectric layer formed over the substrate. The inductor structure includes a first metal layer formed in the first dielectric layer and a second dielectric layer over the first metal layer. The inductor structure further includes a magnetic layer formed over the first dielectric layer, and the magnetic layer has a top surface, a bottom surface and sidewall surfaces between the top surface and the bottom surface, and the sidewall surfaces have at least two intersection points.

In some embodiments, an inductor structure is provided. The inductor structure includes a substrate and a first metal layer formed in a first dielectric layer. The inductor structure includes a magnetic layer formed on the first dielectric layer, and the magnetic layer has an octagon or trapezoid structure. The inductor structure also includes an oxide layer formed adjacent to magnetic layer. The inductor structure further includes a second dielectric layer formed over the magnetic layer and the oxide layer and a second metal layer formed on a second dielectric layer.

In some embodiments, a method for forming an inductor structure is provided. The method includes providing a substrate and forming a first metal layer in a first dielectric layer. The method also includes forming and patterning a oxide layer to form an opening in the oxide layer, and conformally forming a magnetic material on the oxide layer and in the opening. The method also includes forming a photoresist layer over the magnetic material, and performing a wet etching process on the magnetic material to form a magnetic layer. The method further includes forming a second dielectric layer on the magnetic layer and forming a second metal layer on the second dielectric layer.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An inductor structure, comprising:
    a substrate;
    a first dielectric layer formed over the substrate;
    a first metal layer formed in the first dielectric layer; and
    a magnetic layer formed over the first dielectric layer, wherein the magnetic layer has more than four edges in a cross section view.

2. The inductor structure as claimed in claim 1, further comprising:
    an etch stop layer formed on the first metal layer, wherein the magnetic layer is insulated from the first metal layer by the etch stop layer.

3. The inductor structure as claimed in claim 1, wherein the magnetic layer comprises a top surface, a first sidewall surface extending upward from the top surface.

4. The inductor structure as claimed in claim 3, wherein the magnetic layer further comprises a second sidewall surface sloped downward from a top of the first sidewall.

5. The inductor structure as claimed in claim 4, wherein the magnetic layer further comprises a third sidewall surface connected to a bottom of the second sidewall surface, and wherein the third sidewall surface is substantially parallel to the first sidewall surface.

6. The inductor structure as claimed in claim 1, wherein the magnetic layer has an octagon structure in the cross section view.

7. The inductor structure as claimed in claim 1, wherein the magnetic layer comprises cobalt (Co), zirconium (Zr), tantalum (Ta) and niobium (Nb), rhenium (Re), neodymium (Nd), praseodymium (Pr), or dysprosium (Dy) or combinations thereof.

8. The inductor structure as claimed in claim 1, further comprising:
    a second dielectric layer formed on the first dielectric layer;
    a via formed in the second dielectric layer; and
    a second metal layer formed on the via, wherein the second metal layer is electrically connected to the first metal layer by the via.

9. The inductor structure as claimed in claim 8, wherein the first metal layer, the via and the second metal layer form a spiral structure.

10. The inductor structure as claimed in claim 9, wherein the magnetic layer is surrounded by the spiral structure.

11. An inductor structure, comprising:
a substrate;
a conductive layer formed in a first dielectric layer; and
a magnetic layer formed over the first dielectric layer, wherein the magnetic layer has a recession on its top.

12. The inductor structure as claimed in claim 11, further comprising:
an etch stop layer formed over the conductive layer, wherein the conductive layer is insulated from the magnetic layer by the etch stop layer.

13. The inductor structure as claimed in claim 11, wherein the magnetic layer has a top surface, a bottom surface and sidewall surfaces extending from the top surface to the bottom surface, and the sidewall surfaces have at least two intersections therebetween.

14. The inductor structure as claimed in claim 11, wherein the magnetic layer has surfaces more than six.

15. The inductor structure as claimed in claim 11, further comprising a dielectric layer filling the recession.

16. An inductor structure, comprising:
a substrate;
a first dielectric layer formed over the substrate;
a first metal layer formed in the first dielectric layer; and
a magnetic layer formed over the first dielectric layer, wherein the magnetic layer has a trapezoid structure in a cross section view.

17. The inductor structure as claimed in claim 16, further comprising:
an etch stop layer formed on the first metal layer, wherein the magnetic layer is insulated from the first metal layer by the etch stop layer.

18. The insulator structure as claimed in claim 16, wherein the magnetic layer comprises cobalt (Co), zirconium (Zr), tantalum (Ta) and niobium (Nb), rhenium (Re), neodymium (Nd), praseodymium (Pr), or dysprosium (Dy) or combinations thereof.

19. The inductor structure as claimed in claim 16, further comprising:
a second dielectric layer formed on the first dielectric layer;
a via formed in the second dielectric layer; and
a second metal layer formed on the via, wherein the second metal layer is electrically connected to the first metal layer by the via.

20. The inductor structure as claimed in claim 19, wherein the first metal layer, the via and the second metal layer form a spiral structure, and wherein the magnetic layer is surrounded by the spiral structure.

\* \* \* \* \*